United States Patent
Chang et al.

(10) Patent No.: US 12,241,929 B2
(45) Date of Patent: Mar. 4, 2025

(54) WORK PRESS ASSEMBLY FOR TEST HANDLER

(71) Applicant: Taiwan Semiconductor Manufacturing Company, Ltd., Hsin-Chu (TW)

(72) Inventors: Yi-Neng Chang, Hsinchu County (TW); Ting-Yu Chiu, Hsinchu County (TW); Chien Fang Huang, Hsinchu County (TW); Shin-Han You, Taoyuan (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 137 days.

(21) Appl. No.: 18/304,600

(22) Filed: Apr. 21, 2023

(65) Prior Publication Data
US 2024/0353477 A1    Oct. 24, 2024

(51) Int. Cl.
*G01R 31/28*    (2006.01)

(52) U.S. Cl.
CPC ..... *G01R 31/2867* (2013.01); *G01R 31/2863* (2013.01); *G01R 31/2875* (2013.01)

(58) Field of Classification Search
CPC ............ G01R 31/2867; G01R 31/2863; G01R 31/2875
See application file for complete search history.

(56) References Cited

U.S. PATENT DOCUMENTS

| | | |
|---|---|---|
| 4,588,092 A | 5/1986 | Moechnig et al. |
| 5,184,068 A | 2/1993 | Twigg et al. |
| 5,290,134 A | 3/1994 | Baba |
| 5,865,319 A | 2/1999 | Okuda et al. |
| 5,869,976 A | 2/1999 | Kelley et al. |
| 6,204,680 B1 | 3/2001 | Swart et al. |
| 6,518,745 B2 | 2/2003 | Kim et al. |
| 7,701,200 B1 | 4/2010 | Fahrner et al. |
| 8,242,794 B2 | 8/2012 | Cho |
| 8,294,481 B2 | 10/2012 | Akahoshi et al. |

(Continued)

FOREIGN PATENT DOCUMENTS

| | | |
|---|---|---|
| KR | 100206642 B1 | 7/1999 |
| WO | 2022112480 A1 | 6/2022 |

*Primary Examiner* — Giovanni Astacio-Oquendo
*Assistant Examiner* — Zannatul Ferdous
(74) *Attorney, Agent, or Firm* — HAYNES AND BOONE, LLP

(57) ABSTRACT

An exemplary work press assembly for a test handler includes a presser and a guide frame. The presser is configured to secure a device under test (DUT) and press the DUT into a socket for testing. The guide frame is configured to receive guide pins of the socket. The presser extends through an opening of the guide frame, and the guide frame is sandwiched between a first presser portion and a second presser portion. The presser is formed of a first material having a first coefficient of thermal expansion (CTE), and the guide frame is formed from a second material having a second CTE that is less than the first CTE. In some embodiments, a thermal insulation layer(s) separates the presser from the guide frame. In some embodiments, a spacing between sidewalls of the presser and sidewalls of the guide frame is configured to accommodate thermal expansion of the presser.

20 Claims, 6 Drawing Sheets

(56) References Cited

U.S. PATENT DOCUMENTS

| | | |
|---|---|---|
| 9,207,272 B2 | 12/2015 | Oh et al. |
| 9,244,119 B2 | 1/2016 | Choi et al. |
| 9,347,985 B2 | 5/2016 | Ireland et al. |
| 9,791,504 B2 | 10/2017 | Kupniewski et al. |
| 2002/0020927 A1 | 2/2002 | Akram et al. |
| 2003/0164716 A1 | 9/2003 | Hsieh et al. |
| 2005/0164530 A1 | 7/2005 | Yates et al. |
| 2009/0031955 A1 | 2/2009 | Lu et al. |
| 2009/0206860 A1* | 8/2009 | McFarland ........ G01R 31/2891 324/750.03 |
| 2010/0230908 A1 | 9/2010 | Akahoshi et al. |
| 2012/0286817 A1* | 11/2012 | Duckworth ........ G01R 1/06711 324/755.01 |
| 2014/0266281 A1 | 9/2014 | Wang et al. |
| 2015/0137844 A1 | 5/2015 | Kikuchi et al. |
| 2015/0185282 A1 | 7/2015 | Wang et al. |
| 2016/0154023 A1 | 6/2016 | Choi et al. |
| 2016/0377656 A1* | 12/2016 | Liberini ............ G01R 1/07357 324/756.03 |

\* cited by examiner

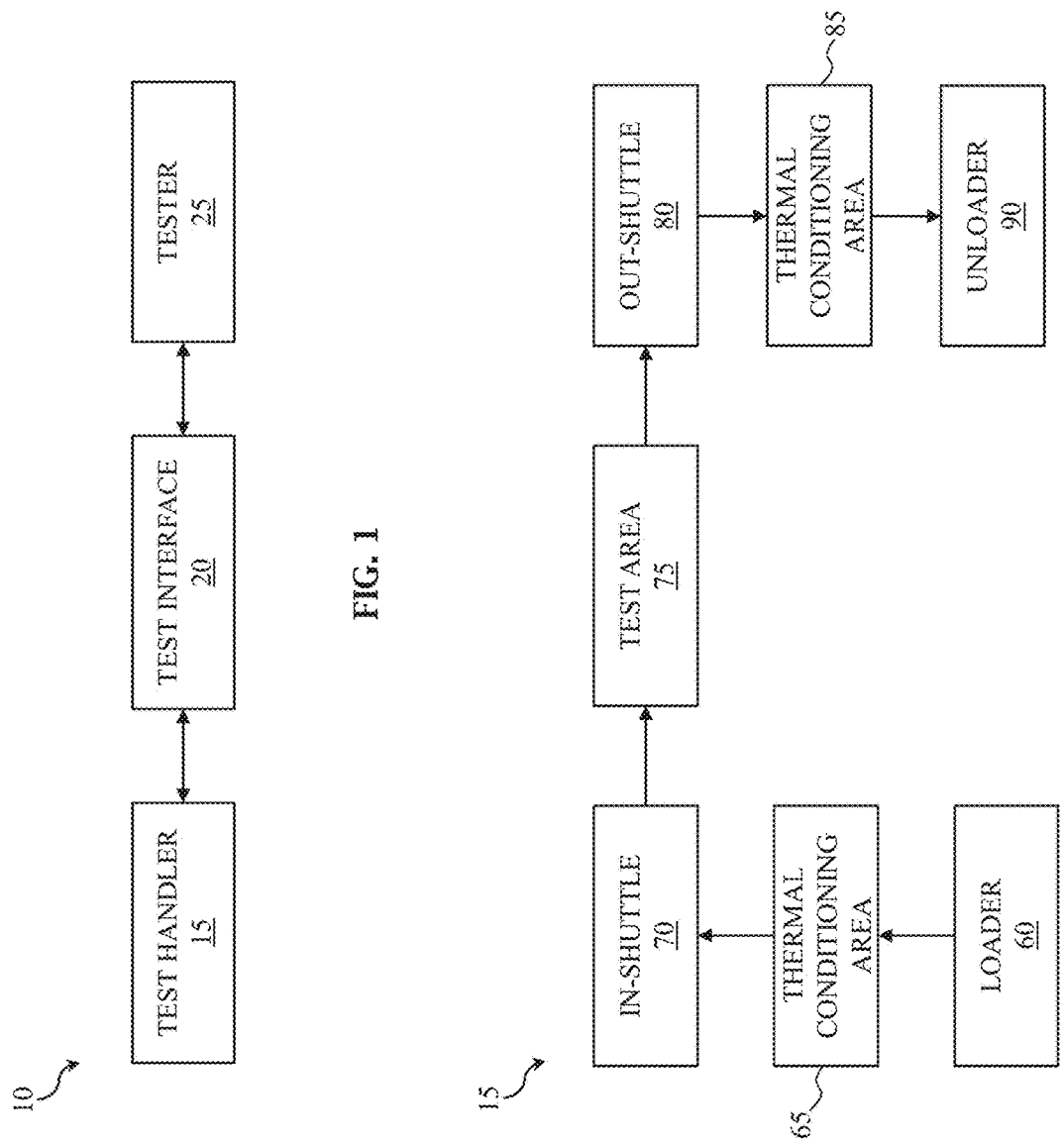

WORK PRESS ASSEMBLY FOR TEST HANDLER

BACKGROUND

Testing is an important step in ensuring an integrated circuit's reliability, integrity, and performance. Thermal management during testing, such as thermal management of the integrated circuit and thermal management of testing systems performing the tests, has become a challenge. Although existing thermal management techniques have been generally adequate for their intended purposes, they have not been entirely satisfactory in all respects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIG. 1 is a block diagram of a test system for testing integrated circuits, in portion or entirety, according to various aspects of the present disclosure.

FIG. 2 is a block diagram of a test handler, in portion or entirety, of the test system of FIG. 1 according to various aspects of the present disclosure.

DETAILED DESCRIPTION

Figure 3:
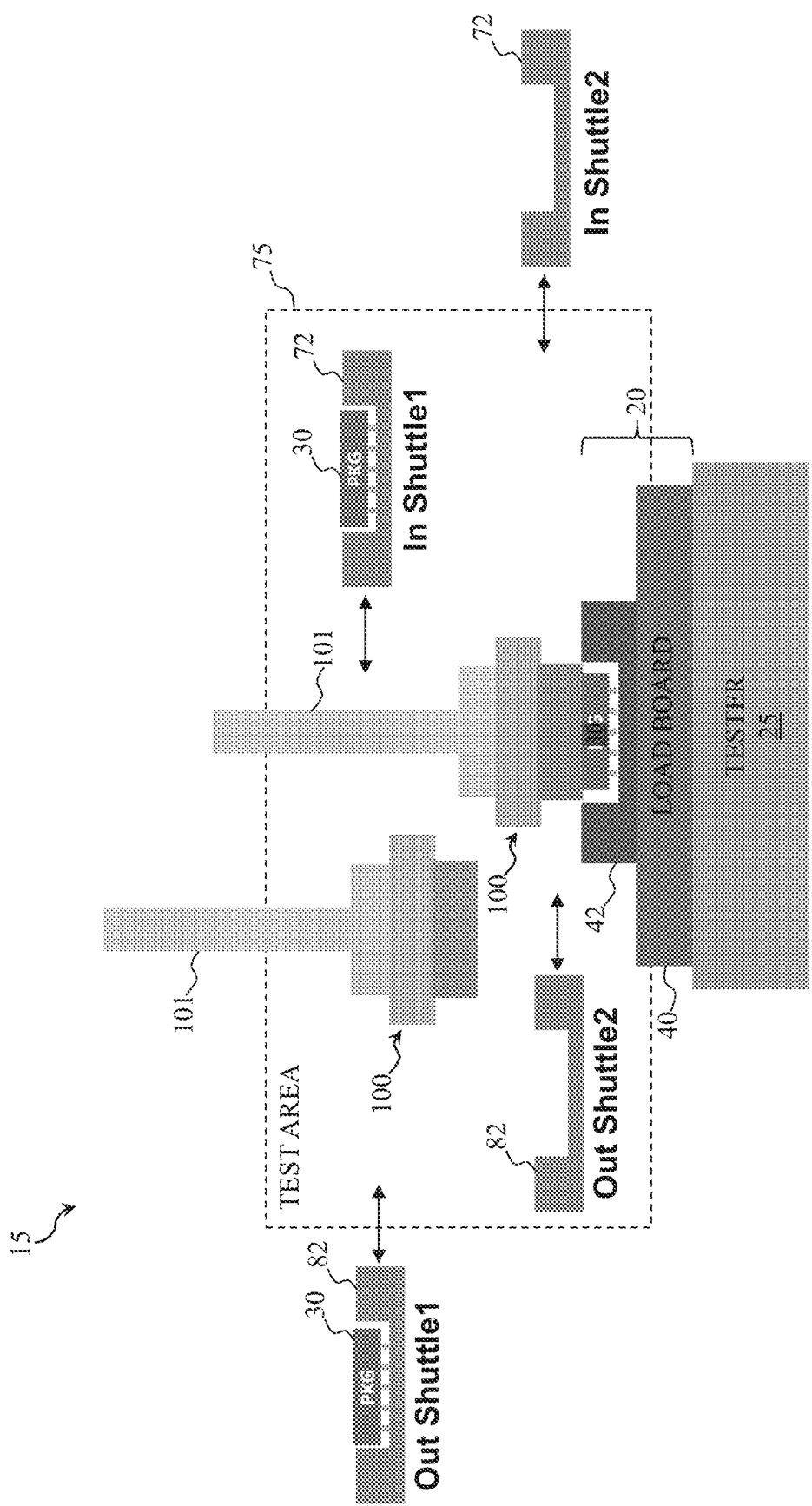
FIG. 3 is a cross-sectional view of the test handler of FIG. 2, in portion or entirety, according to various aspects of the present disclosure.

The present disclosure relates generally to testing of integrated circuit (IC) and/or semiconductor devices, and more particularly, to test handlers for IC testing systems.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact and may also include embodiments in which additional features may be formed between the first and second features, such that the first and second features may not be in direct contact. In addition, spatially relative terms, for example, "lower," "upper," "horizontal," "vertical," "above," "over," "below," "beneath," "up," "down," "top," "bottom," etc. as well as derivatives thereof (e.g., "horizontally," "downwardly," "upwardly," etc.) are used for case of the present disclosure of one features relationship to another feature. The spatially relative terms are intended to cover different orientations of the device including the features. The present disclosure may also repeat reference numerals and/or letters in the various examples. This repetition is for the purpose of simplicity and clarity and does not in itself dictate a relationship between the various embodiments and/or configurations discussed.

Further, when a number or a range of numbers is described with "about," "approximate," and the like, the term is intended to encompass numbers that are within a reasonable range considering variations that inherently arise during manufacturing as understood by one of ordinary skill in the art. For example, the number or range of numbers encompasses a reasonable range including the number described, such as within +/−10% of the number described, based on known manufacturing tolerances associated with manufacturing a feature having a characteristic associated with the number. For example, a material layer having a thickness of "about 5 nm" can encompass a dimension range from 4.5 nm to 5.5 nm where manufacturing tolerances associated with depositing the material layer are known to be +/−10% by one of ordinary skill in the art. Furthermore, given the variances inherent in any manufacturing process, when device features are described as having "substantial" properties and/or characteristics, such term is intended to capture properties and/or characteristics that are within tolerances of manufacturing processes. For example, "substantially vertical" or "substantially horizontal" features are intended to capture features that are approximately vertical and horizontal within given tolerances of the manufacturing processes used to fabricate such features—but not necessarily mathematically or perfectly vertical and horizontal.

Thermal management during IC testing, such as thermal management of an IC being tested and thermal management of a testing system performing the tests, has become a challenge. For example, thermal management of the IC has been observed to impact reliability of a test handler of a test system. As an example, a work press assembly of a test handler may be formed of a thermally conductive material to facilitate heat transfer between a thermal source and a device under test, which leads to thermal expansion of the work press assembly. The thermal expansion can cause alignment/guide means of the work press assembly (e.g., guide holes) to laterally shift relative to alignment/guide means of a test interface (e.g., guide pins). Alignment/guide means of the work press assembly may thus physically contact and/or rub against the alignment/guide means of the test interface, which causes abnormal wear of the work press assembly and degrades its reliability. Alignment/guide means of the work press assembly can also become stuck in alignment/guide means of the test interface because of the lateral shifting, which can destroy vacuum means securing the device under test to the work press assembly and cause the work press assembly to drop and damage the device under test.

The present disclosure addresses such challenges by providing an improved work press assembly for a test handler that can reduce thermal conductivity, and thus thermal expansion, of an outer, alignment/guide region thereof. The disclosed work press assembly separates an outer, alignment/guide region from a presser region of the work press assembly. A coefficient of thermal expansion and a thermal conductivity of a material of the alignment/guide region is less than a coefficient of thermal expansion and a thermal conductivity, respectively, of a material of the presser region, which reduces and/or prevents thermal expansion of the alignment/guide region while allowing the presser region to facilitate heat transfer between a thermal source and a device under test. Thermal insulation layers, such as fiberglass layers, can be formed between the alignment/guide region and the presser region to further reduce thermal conductivity and/or thermal expansion of the alignment/guide region. For example, the thermal insulation layers can significantly reduce and/or prevent heat transfer from the presser region to the alignment/guide region. Since the presser region is formed of a thermally conductive material to facilitate heat transfer and will thus experience thermal expansion, dimensions of the alignment/guide region and the presser region are configured to provide expansion buffer areas and/or minimize contact therebetween. For example, the dimensions are configured to provide spacings between the alignment/guide region and the presser region, where the spacings are configured to accommodate thermal expansion of the presser region. Reducing and/or preventing thermal expansion of the alignment/guide region of the work press assembly, along with accommodating for thermal expansion of the presser region, can reduce and/or prevent lateral shifting of alignment/guide means of the work press assembly relative to alignment/guide means of a test interface, thereby improving reliability of the work press assembly and/or quality of tested devices (i.e., reduce damage from dropping). Different embodiments may have different advantages, and no particular advantage is required of any embodiment.

Figure 4:
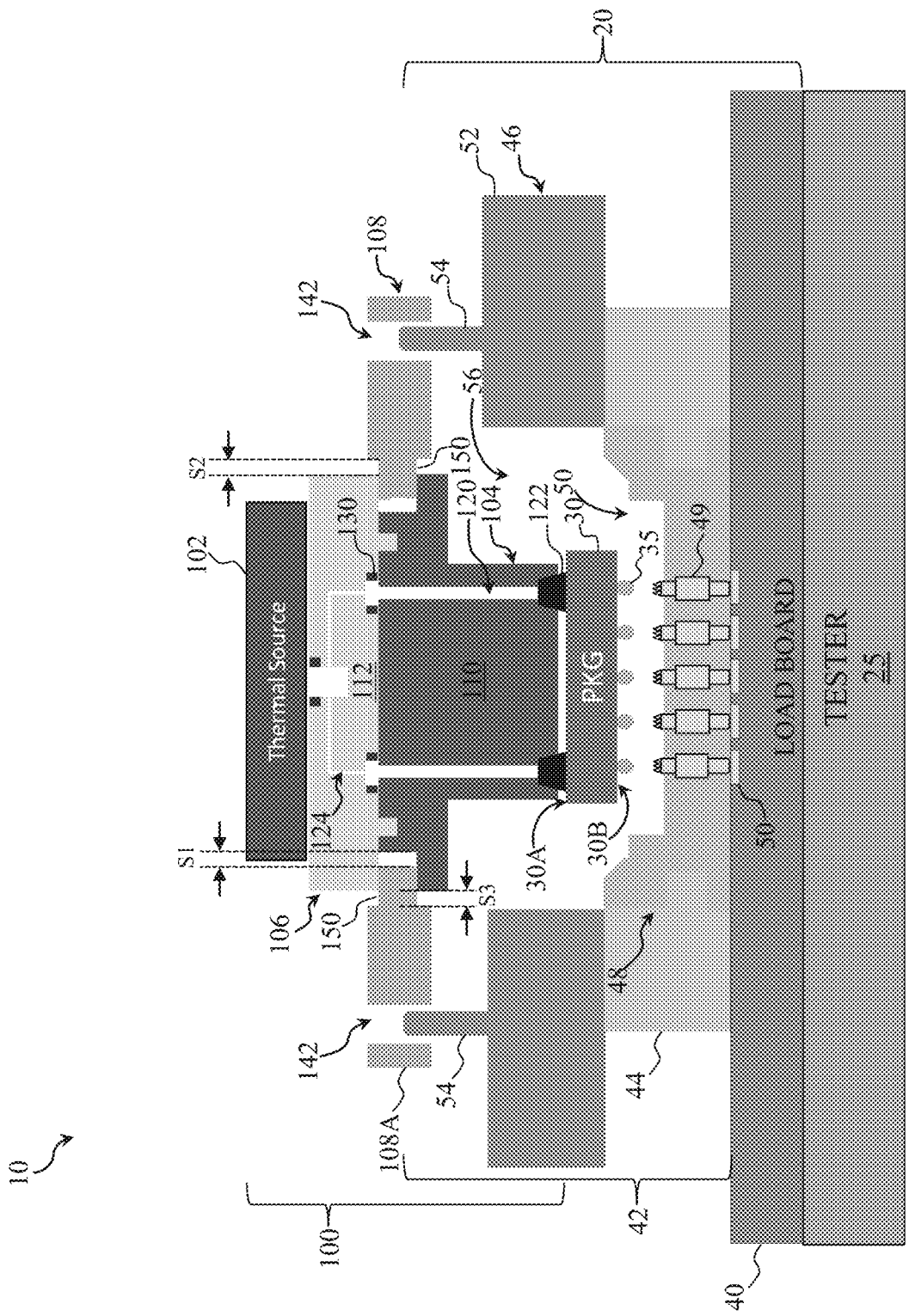
FIG. 4 is a cross-sectional view of the test system of FIG. 1, in portion or entirety, according to various aspects of the present disclosure.
Figure 5:
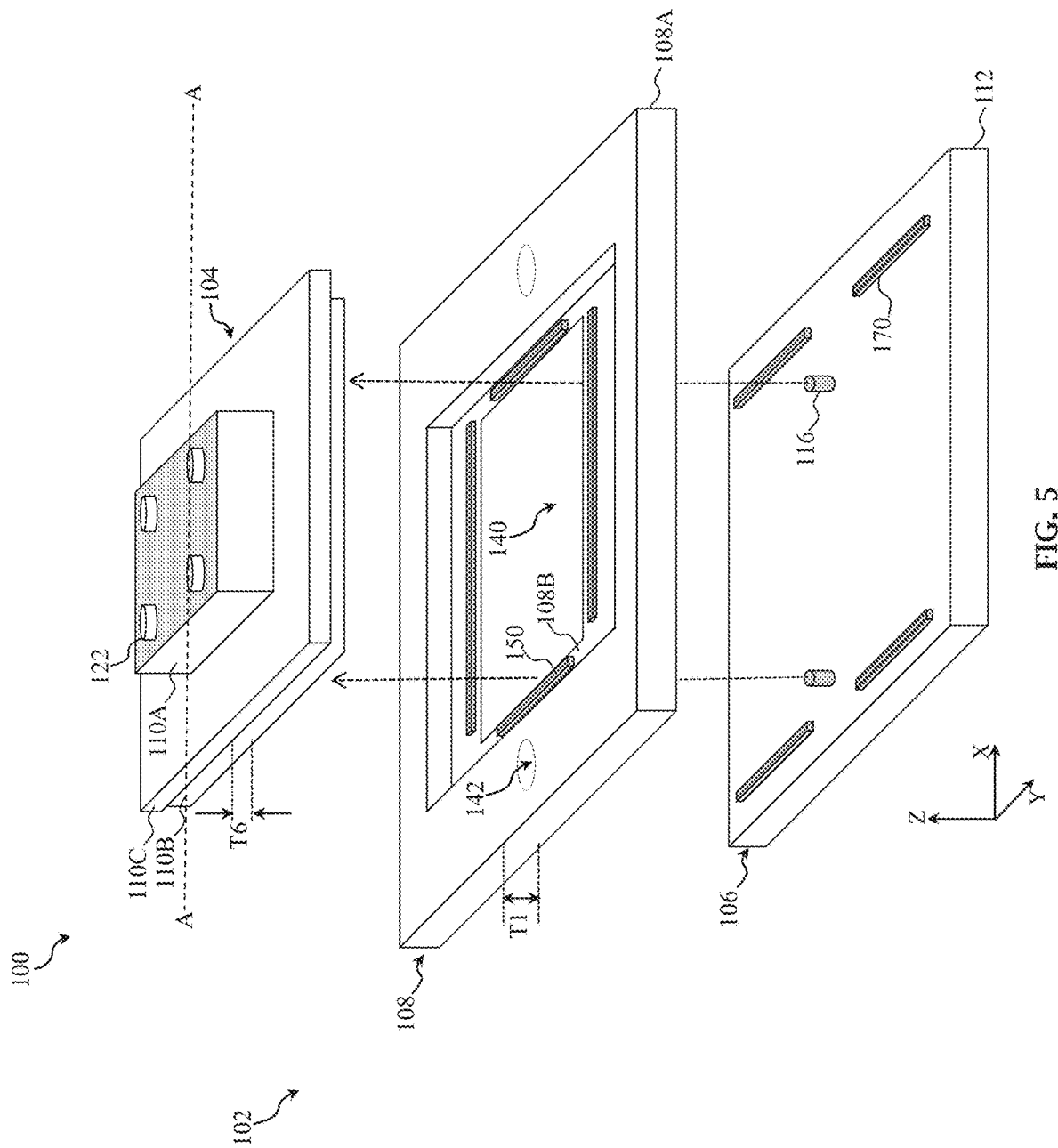
FIG. 5 is a perspective view of a work press assembly, in portion or entirety, of the test handler of FIGS. 1-4 according to various aspects of the present disclosure.
Figure 6:
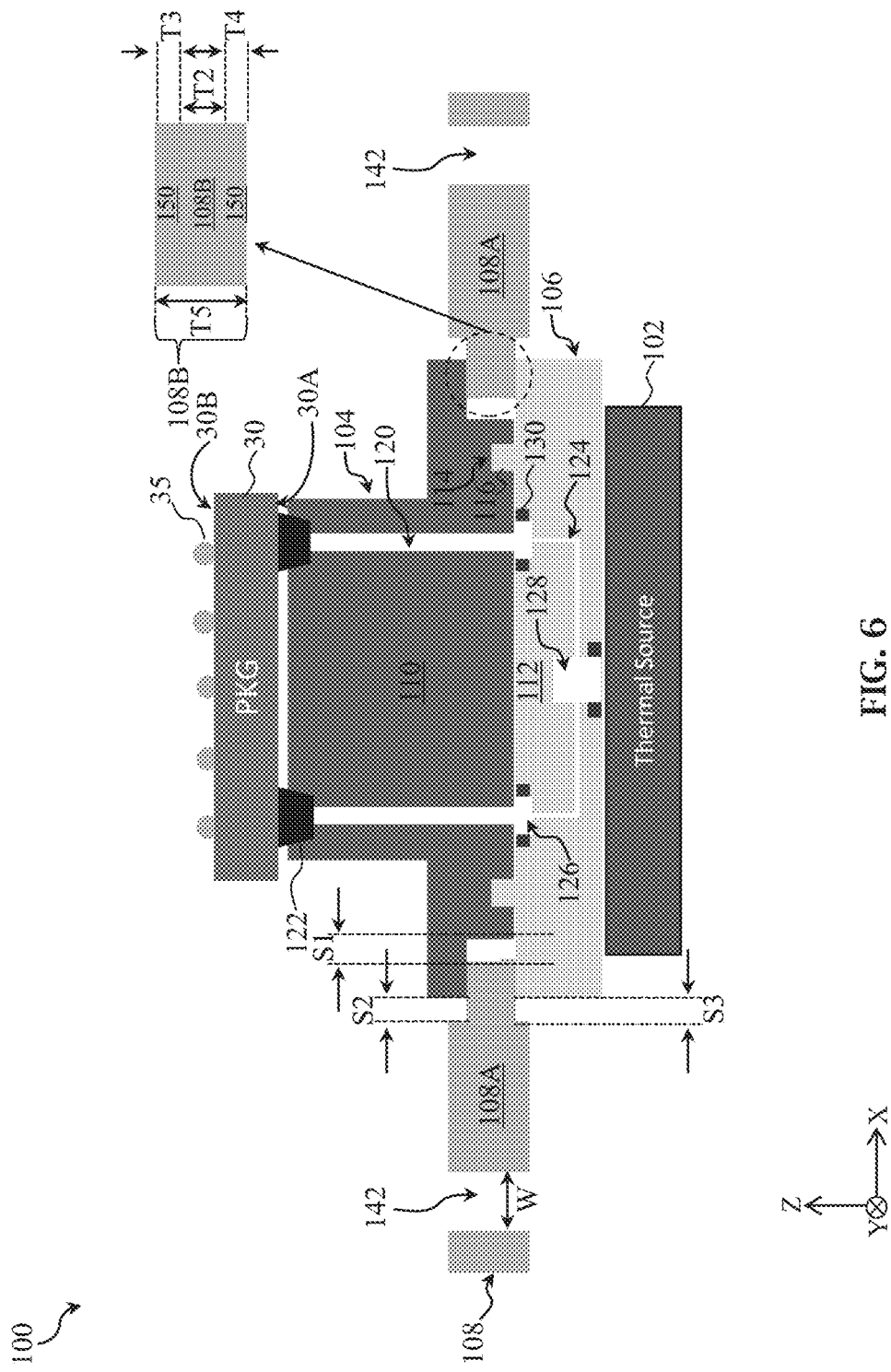
FIG. 6 is a cross-sectional view of the work press assembly of FIG. 5, in portion or entirety, according to various aspects of the present disclosure.

FIG. 1 is a block diagram of an exemplary test system 10 for IC testing, in portion or entirety, according to various aspects of the present disclosure. FIG. 2 is a block diagram of a test handler, in portion or entirety, of test system 10 according to various aspects of the present disclosure. FIG. 3 is a cross-sectional view of the test handler, in portion or entirety, of FIG. 1 and FIG. 2 according to various aspects of the present disclosure. FIG. 4 is a cross-sectional view of test system 10, in portion or entirety, according to various aspects of the present disclosure. FIG. 5 is an exploded perspective view of a work press assembly, in portion or entirety, of the test handler of FIGS. 1-4 according to various aspects of the present disclosure. FIG. 6 is a cross-sectional view of the work press assembly of the test handler of FIG. 5 along line A-A when assembled, in portion or entirety, according to various aspects of the present disclosure. FIGS. 1-6 are discussed concurrently herein for ease of description and understanding. FIGS. 1-6 have been simplified for the sake of clarity to better understand the inventive concepts of the present disclosure. Additional features can be added in test system 10 and/or components thereof (e.g., the test handler and/or the work press assembly thereof), and some of the features described below can be replaced, modified, or eliminated in other embodiments of test system 10 and/or components thereof.

Test system 10 includes a test handler 15, a test interface 20, and a tester 25 (also referred to as automatic/automated test equipment (ATE)). Test system 10 is configured to test a quality and/or a functionality of a device under test (DUT), such as a DUT 30. For example, test handler 15 places DUTs in mechanical and/or electrical contact with tester 25 via test interface 20, and tester 25 performs tests on the DUTs and evaluates performance and/or characteristics thereof. Based on the test results (e.g., pass or fail), the DUTs are classified and/or sorted by test handler 15. Test system 10 can evaluate DUTs' electrical characteristics, reliability, behavior, other characteristics and/or behaviors, or combinations thereof in response to various input and/or conditions (e.g., particular temperatures). In some embodiments, test system 10 evaluates electrical characteristics and/or operation of DUTs at high temperatures. In some embodiments, test system 10 subjects DUTs to reliability tests, such as thermal cycling tests and/or thermal shock tests. In some embodiments, test system 10 performs final tests on DUTs.

DUT 30 can be a semiconductor and/or IC device, semiconductor and/or IC chip, semiconductor and/or IC package, or combinations thereof. In the depicted embodiment, DUT 30 is an IC package having vertically stacked chips, such as a three-dimensional IC (3DIC) package or a 2.5D IC package (e.g., an IC package that implements an interposer). For example, DUT 30 can be a chip-on-wafer-on-substrate (CoWoS) package, an integrated-fan-out (InFO) package, a system-on-IC (SoIC) package, a multi-dimensional package that implements local silicon interconnect (LSI) (e.g., a CoWoS-L package or an InFO-L package), other 3DIC and/or 2.5D IC package, or a hybrid package that implements a combination of multichip packaging technologies. Each chip of the IC package includes at least one functional IC, such as an IC that performs a logic function, a memory function, a digital function, an analog function, a mixed signal function, a radio frequency function, an input/output (I/O) function, a communications function, a power management function, other function, or combinations thereof. In some embodiments, a chip has multiple functions, such as a system-on-chip (SoC). In some embodiments, the SoC has an entire system, such as a computer system, thereon.

DUT 30 has a surface 30A and a surface 30B, which may be referred to as a top surface and a bottom surface, respectively. In some embodiments, DUT 30 has a width (e.g., an x-dimension) and/or a length (e.g., a y-dimension) that is greater than about 45 mm. In such embodiments, a surface area of surface 30A and/or surface 30B is greater than about 2025 mm². DUT contacts 35 are disposed along surface 30B and facilitate electrical interconnection of DUT 30 to test interface 20/tester 25. DUT contacts 30 are formed from an electrically conductive material. DUT contacts 30 can be arranged on surface 30B to form a contact array/pattern, such as a ball grid array. In some embodiments, DUT contacts 35 are solder balls.

Test interface 20 provides a mechanical and electrical interface between tester 25 and DUT 30, and test interface 20 routes signals between tester 25 and DUT 30, such as test signals from tester 25 to DUT 30 and response signals from DUT 30 to tester 25. Test interface 20 can include a load board 40, such as a printed circuit board (PCB), and a socket 42 mounted on load board 40. Load board 40 is electrically connected to tester 25, and socket 42 is electrically connected to load board 40. Load board 40 and/or socket 42 can be attached to and/or form a portion of test handler 15 and/or tester 25. In some embodiments, load board 40 and/or socket 42 are attached to and/or form a portion of a test head. Configurations of test interface 20, load board 40, and socket 42 depend on a type and/or a configuration of DUTs being tested by test system 10 and/or a type of test(s) performed on DUTs by test system 10.

Socket 42 includes a socket base 44 and a socket guide 46. Socket base 44 includes a contactor 48 having socket contacts 49, such as a probe card having probe pins, and a cavity 50 therein for receiving DUT 30. Socket contacts 49 have load board-facing ends and DUT-facing ends. Load board-facing ends are physically and/or electrically connected to load board contacts 50 of load board 40. DUT-facing ends are configured and arranged to physically and/or electrically connect to DUT contacts 35 when DUT 30 is inserted into cavity 50 and pressed into contactor 48 by test handler 15 as described below. Socket contacts 49 can be spring-loaded pins (e.g., pogo pins), various-shaped contacts disposed in elastomer, particle interconnects, other suitable types of contacts and/or interconnects, or combinations thereof. Socket contacts 49 and load board contacts (pads) 50 are formed from an electrically conductive material.

Socket guide 46 includes a guide plate 52 having guide pins 54 extending therefrom and an opening 56 therein that exposes contactor 48 of socket base 44. Socket guide 46 and socket base 44 are configured to facilitate seamless inserting and removing of DUTs by test handler 15, including proper positioning and alignment of DUT 30 within socket 42 (i.e., DUT contacts 35 are aligned with and adequately contact socket contacts 49 during testing). For example, dimensions of opening 56, dimensions of cavity 50, and dimensions of guide plate 52 and/or guide pins 54 are configured to receive, guide, and secure test handler 15 into a position in socket 42 that establishes contact and alignment of DUT contacts 35 and socket contacts 49. In the depicted embodiment, dimensions of opening 56 are greater than dimensions of cavity 50, such that a portion of test handler 15 (e.g., a work press assembly thereof) can move through socket guide 46 to insert DUT 30 into socket base 44 with minimal lateral shifting. In some embodiments, dimensions (e.g., widths) and locations of guide pins 54 are configured relative to test handler 15 (e.g., accounting for dimensions and locations of guide holes of test handler 15) to minimize lateral shifting of test handler 15 as it presses DUT 30 into socket 42.

Test handler 15 can include a loader 60, a thermal conditioning area 65, an in-shuttle area 70 (having in-shuttles 72), a test area 75, an out-shuttle area 80 (having out-shuttles 82), a thermal conditioning area 85, and an unloader 90. Loader 60 can receive a carrier tray having DUTs for testing and transfer the DUTs from the carrier tray to a test tray, which is moved to thermal conditioning area 65. In thermal conditioning area 65, the DUTs can be thermally conditioned (e.g., heated and/or cooled) to desired temperatures for testing. For example, the test tray and/or the DUTs are placed on a hot plate and pre-heated to a desired temperature. The thermally conditioned DUTs are then moved to in-shuttle area 70. In in-shuttle area 70, each DUT can be placed in a respective in-shuttle 72 and moved to test area 75 for testing.

In test area 75, work press assemblies 100 move and position DUTs 30 for testing. Each work press assembly 100 has a respective arm 101 that moves it within test area 75 and/or moves it in and out of socket 42. For example, when test area 75 receives an in-shuttle (e.g., In Shuttle 2) with a DUT for testing, an arm (e.g., arm 101) can move its respective work press assembly (e.g., work press assembly 100) to the in-shuttle and proximate to the DUT, such that the work press assembly can pick up and secure the DUT thereto. The arm can then move the respective work press assembly (which is holding the DUT) to and press the respective work press assembly into socket 42 of test interface 20. The arm/work press assembly apply sufficient pressure to ensure that the DUT is placed in physical and electrical contact with socket 42 for testing. After tester 25 tests the DUT, the arm can move the respective work press assembly to an out-shuttle (e.g., Out Shuttle 2), such that the work press assembly can release/place the tested DUT in the out shuttle, which then moves the tested DUT to out-shuttle area 80.

In some embodiments, in out-shuttle area 80, the tested DUTs are removed from out-shuttles 82 and placed into a test tray and/or a carrier tray. In some embodiments, the out-shuttles 82 transfer the tested DUTs to unloader 90 or thermal conditioning area 85. Unloader 90 can sort, classify, and bin the tested DUTs based on the test results. For example, unloader 90 sorts the tested DUTs based on pass/fail criteria, such that the tested DUTs are sorted into passed devices/packages and failed devices/packages. In some embodiments, the tested DUTs are placed into carrier trays based on their classifications/binning. In some embodiments, a tray of the tested DUTs and/or the tested DUTs are moved to thermal conditioning area 85 before sorting by unloader 90. In thermal conditioning area 85, the tested DUTs can be thermally conditioned (e.g., heated and/or cooled) to desired temperatures. For example, after high temperature testing, the tested DUTs can be cooled to ambient temperature.

In-shuttles 72 can move between in-shuttle area 70 and test area 75, and out-shuttles 82 can move between out-shuttle area 80 and test area 75. For example, when a DUT is moved from the test tray to an in-shuttle, the in-shuttle transfers the DUT from the in-shuttle area 70 to test area 75. When the DUT is removed from the in-shuttle by a work press assembly in test area 75, the in-shuttle can return to in-shuttle area 70 to receive another DUT. The work press assembly transfers the tested DUT from the in-shuttle to test interface 20/tester 25. After testing is performed on the DUT, the work press assembly transfers the tested DUT from test interface 20/tester 25 to an out-shuttle. When the work press assembly releases the tested DUT into and/or on the out-shuttle, the out-shuttle transfers the tested DUT from test area 75 to out-shuttle area 80. When the DUT is removed from the out-shuttle (e.g., transferred from the out-shuttle to unloader 90), the out-shuttle can return to test area 75 to receive another tested DUT.

Work press assembly 100 includes a thermal source 102, a contact block 104 (also referred to as a contact blade and/or a contact head), a connector 106, and a guide frame 108.

Thermal source 102 can maintain thermal conditions of DUT 30 (e.g., maintain a desired temperature of DUT 30) and/or adjust thermal conditions of DUT 30 (e.g., adjust a temperature of DUT 30) during testing. For example, thermal source 102 transfers thermal energy to/from DUT 30 to heat and/or cool DUT 30 during testing. In some embodiments, thermal source 102 includes a ceramic thermal pad and/or other resistor-based thermal source, such as a thermal rod. In some embodiments, thermal source 102 includes a cooler for circulating a cooling medium (e.g., cooled air) and/or a heater for circulating a heating medium (e.g., heated air). In some embodiments, thermal source 102 functions as a heat sink to reduce a DUT's temperature. In some embodiments, thermal source 102 can include a Peltier device.

Contact block 104 has a body 110 having a DUT-facing portion 110A, a connector-facing portion 110B, and a middle portion 110C between the DUT-facing portion 110A and the connector-facing portion 110B, and connector 106 has a body 112. Contact block 104 and connector 106 (i.e., body 110 and body 112, respectively, thereof) are formed from thermally conductive materials that facilitate a flow of thermal energy (e.g., heat) between thermal source 102 and DUT 30, such that DUT 30 reaches and/or maintains desired temperature(s) during testing. Exemplary thermally conductive materials for contact block 104 and connector 106 include aluminum, copper, other suitable thermally conductive materials, alloys thereof, or combinations thereof. In some embodiments, contact block 104 and connector 106 are formed from the same material. For example, body 110 of contact block 104 and body 112 of connector 106 are formed of aluminum and/or copper. In some embodiments, contact block 104 and connector 106 are formed from different thermally conductive materials.

Contact block 104 is fastened to and/or fixedly attached to connector 106. For example, contact block 104 has attachment holes 114 at a surface of connector-facing portion 110B, connector 106 has attachment pins 116 extending from a contact block facing surface of connector 106, attachment holes 114 are configured to receive attachment pins 116, and attachment pins 116 are configured to insert into attachment holes 114 and secure connector 106 to contact block 104. In some embodiments, attachment holes 114 and attachment pins 116 are guide/alignment holes and guide/alignment pins, respectively. In some embodiments, attachment holes 114 and attachment pins 116 are bolt holes and bolts, respectively. In some embodiments, attachment holes 114 and attachment pins 116 are tapped holes and screws, respectively. Other types of fastening configurations and/or arrangements are contemplated by the present disclosure for attachment holes 114 and attachment pins 116.

Contact block 104 and connector 106 are configured to pick up and secure a DUT, such as DUT 30, thereto, push the DUT into socket 42, and apply sufficient pressure to DUT 30 to establish a connection between DUT 30 and test interface 20/tester 25 (in particular, between DUT contacts 35 and socket contacts 49). Contact block 104 and connector 106 can collectively be referred to as a pusher/plunger of work press assembly 100.

Contact block 104 and connector 106 can be configured to pick up and secure DUT 30 by vacuum, thereby providing work press assembly 100 with a vacuum head/pusher. In the depicted embodiment, contact block 104 has channels 120 in body 110, where each channel 120 is fluidly and/or communicatively connected to a respective nozzle 122. Connector 106 has channels 124 in body 112, where each channel 124 is fluidly and/or communicatively connected to a respective recess/groove 126 at a contact block facing surface of connector 106 and a recess/groove 128 at a thermal source facing surface of connector 106. Channels 120 of contact block 106 are fluidly and/or communicatively connected to recess/grooves 126 and channels 124 of connector 106. Channels 120, nozzles 122, channels 124, recess/grooves 126, recess/groove 128, or combinations thereof can provide contact block 104/connector 106 with a vacuum suction system for picking up and holding onto DUTs. For example, channels 120, nozzles 122, channels 124, recess/grooves 126, recess/groove 128, or combinations thereof are connected to a vacuum generator/source/system (e.g., a vacuum pump) to create vacuum suction power in contact block 104/connector 106, such that DUT 30 can be vacuum suctioned/attached to nozzles (suction cups) 122 of contact block 104. In such embodiments, channels 120 and channels 124 can be referred to as vacuum channels/lines. Gaskets 130 can be provided in recess/grooves 126 and recess/groove 128, for example, to seal gaps/interfaces between connector 106 and contact block 104/thermal source 102, respectively. In some embodiments, gaskets 130 are O-rings.

Guide frame 108 forms an outer ring of work press assembly 100 and bounds the presser/plunger (i.e., contact block 104/connector 106) of work press assembly 100. Guide frame 108 has an outer frame 108A and an inner frame 108B. An opening 140 in guide frame 108 is defined by inner frame 108B, and the presser of work press assembly 100, such as connector-facing portion 110B of contact block 104, extends through opening 140. Outer frame 108A has a thickness T1, and inner frame 108B has a thickness T2. Thickness T2 is less than thickness T1, and inner frame 108B protrudes from outer frame 108A, such that inner frame 108B forms an inner, recessed ledge of guide frame 108 that contact block 104 and connector 106 secure therebetween when assembled. In the depicted embodiment, a top surface of inner frame 108B is recessed from a top surface of outer frame 108A, and a bottom surface of inner frame 108B is recessed from a bottom surface of outer frame 108A.

Guide frame 108 is configured to guide and secure work press assembly 100 into a position in socket 42 that establishes contact and alignment of DUT contacts 35 and socket contacts 49. For example, outer frame 108A has guide holes 142 therein for receiving guide pins 54 of socket guide 46. Dimensions and locations of guide holes 142 are configured relative to socket guide 46 (e.g., accounting for dimensions and locations of guide pins 54 thereof) to align/guide and/or minimize lateral shifting of work press assembly 100. For example, widths of guide holes 142 are about 0.7% to about 1.5% greater than (i.e., slightly greater than) widths of guide pins 54. In some embodiments, a width W of guide holes 142 is about 3.5 mm to about 4.5 mm. In some embodiments, width W of guide holes 142 is about 4.02 mm+0.02 mm. In some embodiments, guide frame 108 rests upon socket guide 46 during testing. In some embodiments, socket 42 is configured to prevent over-pressing (i.e., too much pressure).

To reduce and/or prevent thermal conduction and thus thermal expansion of an outer region of work press assembly 100 (in particular, a region of work press assembly 100 that positions and aligns the presser of work press assembly 100 and thus DUT 30 relative to socket 42) and shifting of guide holes 142, guide frame 108 is formed from a material having a thermal conductivity and a coefficient of thermal expansion (CTE) that is less than a thermal conductivity and CTE, respectively, of a material forming the presser of work press assembly 100 (i.e., contact block 104 and/or connector 106). For example, a CTE of a material forming guide frame 108 is less than a CTE of a material forming body 110 of contact block 104, and in some embodiments, is also less than a CTE of a material forming body 112 of connector 106. In some embodiments, guide frame 108 (i.e., outer frame 108A/inner frame 108B) is formed from a material having a CTE that is less than or equal to about $12 \times 10^{-6}$/K, and the presser of work press assembly 100 (i.e., contact block 104 and/or connector 106) is formed from a material having a CTE greater than $12 \times 10^{-6}$/K. Materials having a CTE greater than $12 \times 10^{-6}$/K may not meaningfully prevent and/or reduce thermal conduction and/or thermal expansion of guide frame 108 and thus may still provide a work press assembly that suffers from guide hole shifting as described herein. In some embodiments, guide frame 108 is formed of aluminum silicon carbide (AlSiC). In some embodiments, guide frame 108 is formed of steel. In some embodiments, guide frame 108 is formed of a ceramic material, such as silicon nitride (SiN), aluminum oxide (AlO), aluminum nitride (AlN), other suitable ceramic material, or combinations thereof.

Guide frame 108 can further include thermal insulation layer(s) 150. Thermal insulation layers 150 are disposed on inner frame 108B. In the depicted embodiment, thermal insulation layers 150 are disposed on the top surface and the bottom surface of inner frame 108B, such that inner frame 108B is sandwiched between thermal insulation layers 150. In such embodiments, inner frame 108B is separated from and does not physically touch contact block 104 and/or connector 106. Thermal insulation layers 150 include a material having a thermal conductivity that is less than a thermal conductivity of the material of guide frame 108, such that the material of thermal insulation layers 150 can prevent or significantly reduce a transfer of thermal energy (e.g., heat) between the presser of work press assembly 100 (i.e., contact block 104/connector 106) and guide frame 108. In some embodiments, thermal insulation layers 150 are fiberglass layers. In some embodiments, a thermal conductivity of thermal insulation layers 150 is less than or equal to about 0.06 W/mK (Watts per meter-Kelvin), where thermal conductivity greater than 0.06 W/mK may not meaningfully prevent and/or reduce thermal energy transfer from the presser of work press assembly 100 to inner frame 108B.

Thermal insulation layers 150 on the top surface of inner frame 108B (e.g., connector-facing surface) have a thickness T3, and thermal insulation layers 150 on the bottom surface of inner frame 108B (e.g., contact block-facing surface) have a thickness T4. Thickness T3 and/or thickness T4 is greater than or equal to about 0.8 mm, where thermal insulation layers 150 having thicknesses less than 0.8 mm may not meaningfully prevent and/or reduce thermal energy transfer from the presser of work press assembly 100 to inner frame 108B. In the depicted embodiment, thickness T3 and thickness T4 are the same. In some embodiments, thickness T3 and thickness T4 are different. Thickness T2 of inner frame 108B, thickness T3 of thermal insulation layers 150, and thickness T4 of thermal insulation layers 150 are configured to ensure that an inner, recessed ledge (a total inner frame) of guide frame 108 has a total thickness (e.g., a thickness T5) that is less than thickness T1 of outer frame 108A.

The present disclosure contemplates various configurations and arrangements of thermal insulation layers 150 on inner frame 108B. In the depicted embodiment, inner frame 108B forms a rectangular ring, and each side of the rectangular ring has a respective thermal insulation layer 150 formed thereon. In some embodiments, lengths and/or widths of the thermal insulation layers 150 are less than lengths and/or widths, respectively, of the respective sides of inner frame 108B upon which they are disposed. In some embodiments, a thermal insulation layer 150 covers an entire top surface of inner frame 108B or an entire top surface of one or more sides of inner frame 108B (e.g., a width and a length of a thermal insulation layer is substantially the same as a width and a length of a top surface of a side of inner frame 108B). In some embodiments, a thermal insulation layer 150 covers an entire bottom surface of inner frame 108B or a bottom surface of one or more sides of inner frame 108B. In some embodiments, a width of a thermal insulation layer is substantially the same as a width of a side of inner frame 108B, but a length of the thermal insulation layer is less than a length of the side of inner frame 108B. In such embodiments, the thermal insulation layer extends from outer frame 108B to an edge of inner frame 108B. In some embodiments, a thermal insulation layer is a single, continuous insulation ring (e.g., a rectangular-shaped thermal insulation layer) on inner frame 108B, instead of being formed by discrete layers. In some embodiments, thermal insulation layers are arranged into any suitable pattern of thermal insulation pads on inner frame 108B.

Contact block 104, connector 106, and guide frame 108 are configured to provide spacings (gaps) between guide frame 108 and contact block 104/connector 106 when assembled, such as a spacing S1, a spacing S2, and a spacing S3. Spacing S1 is between contact block 104 and guide frame 108 (in particular, between a sidewall of connector-facing portion 110B of contact block 104 and a sidewall of inner frame 108B of guide frame 108). Spacing S2 is between contact block 104 and guide frame 108 (in particular, between a sidewall of middle portion 110B of contact block 104 and an inner sidewall of a DUT-facing portion of outer frame 108A of guide frame 108). Spacing S3 is between connector 106 and guide frame 108 (in particular, between a sidewall of connector 106 and an inner sidewall of a connector-facing portion of outer frame 108A of guide frame 108). Spacings S1-S3 allow for thermal expansion of the presser of work assembly 100 (i.e., contact block 104/connector 106) that may occur as thermal energy (e.g., heat) transfers through the presser to DUT 30 during testing, pre-testing, and post-testing. Spacings S1-S3 thus act as expansion buffers of work press assembly 100. In some embodiments, spacing S1 is greater than or equal to about 0.5 mm. In some embodiments, spacing S2 is greater than or equal to about 0.5 mm. In some embodiments, spacing S3 is greater than or equal to about 0.5 mm. Spacings between guide frame 108 and the presser of work press assembly 100 that are less than 0.5 mm may not sufficiently accommodate thermal expansion of the presser of work press assembly 100, which can increase physical contact of the presser of work press assembly 100 and guide frame 108, such as direct contact of the presser of work press assembly 100 with inner frame 108B and/or outer frame 108A. Increased physical contact can increase transfer of thermal energy (e.g., heat) from the presser of work press assembly 100 to guide frame 108, which can cause undesired thermal expansion of guide frame 108 and thus undesired shifting of guide pins 142 of guide frame 108. Any configuration of spacings S1-S3 is contemplated by the present disclosure, such as configurations where spacings S1-S3 are the same or any combination of spacings S1-S3 being the same and/or different.

In some embodiments, spacings S1-S3 are achieved by configuring dimensions of contact block 104, connector 106, and guide frame 108 relative to one another. For example, dimensions of opening 140 (e.g., a width and a length) are greater than dimensions (e.g., a width and a length) of connector-facing portion 110B of contact block 104, such that connector-facing portion 110B can extend through opening 140 of guide frame 108 without physically contacting guide frame 108 (in particular, sidewalls of inner frame 108A and/or sidewalls of thermal insulation layers 150). In another example, dimensions of connector 106 (e.g., a width and a length of a contact-block facing surface of connector 106) and dimensions (e.g., a width and a length) of middle portion 110C of contact block 104 are greater than dimensions of opening 140 (e.g., a width and a length) and less than inner dimensions of outer frame 108A (e.g., a distance between inner sidewalls of outer frame 108A), such that inner frame 108A of guide frame 108 can be secured between connector 106 and contact block 104 without connector 106 and contact block 104 physically contacting outer frame 108B (such as inner sidewalls thereof). In some embodiments, contact block 104, connector 106, and guide frame 108 are vertically, center aligned to provide uniform spacing around and/or between the presser of work press assembly 100 and guide frame 108 thereof. For example, spacing S1, spacing S2, and spacing S3 are substantially the same on the right side and the left side of work press assembly 100, such that spacings S1-S3 are uniform around the presser of work press assembly 100.

Guide frame 108 is separate from and not fixedly attached to contact block 104 and connector 106 to further reduce transfer of thermal energy to an outer region of work press assembly 100. For example, guide frame 108 is a separate and independent component of work press assembly 100, and guide frame 108 is not secured to contact block 104 and/or connector 106 by fasteners, such as pins, screws, bolts, nuts, etc. Instead, dimensions of contact block 104, connector 106, and guide frame 108 are configured relative to one another, such that an inner frame of guide frame 108 (here, formed by inner frame 108B and thermal insulation layers 150) is sandwiched between and secured by contact block 104 (in particular, middle portion 110C thereof) and connector 106 in a manner that impedes movement of guide frame 108 relative to contact block 104 and connector 106. For example, dimensions (e.g., a width and a length) of connector-facing portion 110B of contact block 104 are less than dimensions (e.g., a width and a length) of middle portion 110C of contact block 104 and dimensions of connector 106 (e.g., a width and a length of a contact block facing surface of connector 106), such that a gap is formed between middle portion 110C and connector 106 when contact block 104 is attached to connector 106. The gap is configured to receive an inner frame/ledge of guide frame 108. For example, the gap provides a distance between a connector-facing surface of middle portion 110C and a contact block facing surface of connector 106 that is substantially the same as thickness T5 (i.e., a total thickness of the inner, recessed frame/ledge of guide frame 108). In some embodiments, a thickness T6 of connector-facing portion 110B provides the distance between the connector-facing surface of middle portion 110C and the contact block facing surface of connector 106. In such embodiments, thickness T6 is substantially the same as thickness T5. Accordingly, when assembled, inner frame/ledge of guide frame 108 (here, inner frame 108 and thermal insulation layers 150) is confined between middle portion 110C of contact block 104 and connector 106 in a manner that secures guide frame 108 to contact block 104/connector 106 and prevents movement of guide frame 108 relative to contact block 104/connector 106.

In some embodiments, control block 104 and/or connector 106 have thermal insulation layers, such as thermal insulation layers 170 disposed on the contact block facing surface of connector 106. Thermal insulation layers 170 are similar to thermal insulation layers 150. For example, thermal insulation layers 170 include a material having a thermal conductivity that is less than a thermal conductivity of the material of guide frame 108. In some embodiments, thermal insulation layers 170 are fiberglass layers. In some embodiments, a thermal conductivity of thermal insulation layers 170 is less than or equal to about 0.06 W/mK. The present disclosure contemplates various configurations and arrangements of thermal insulation layers 170 on connector 106 and/or thermal insulation layers on contact block 104.

Figure 7:
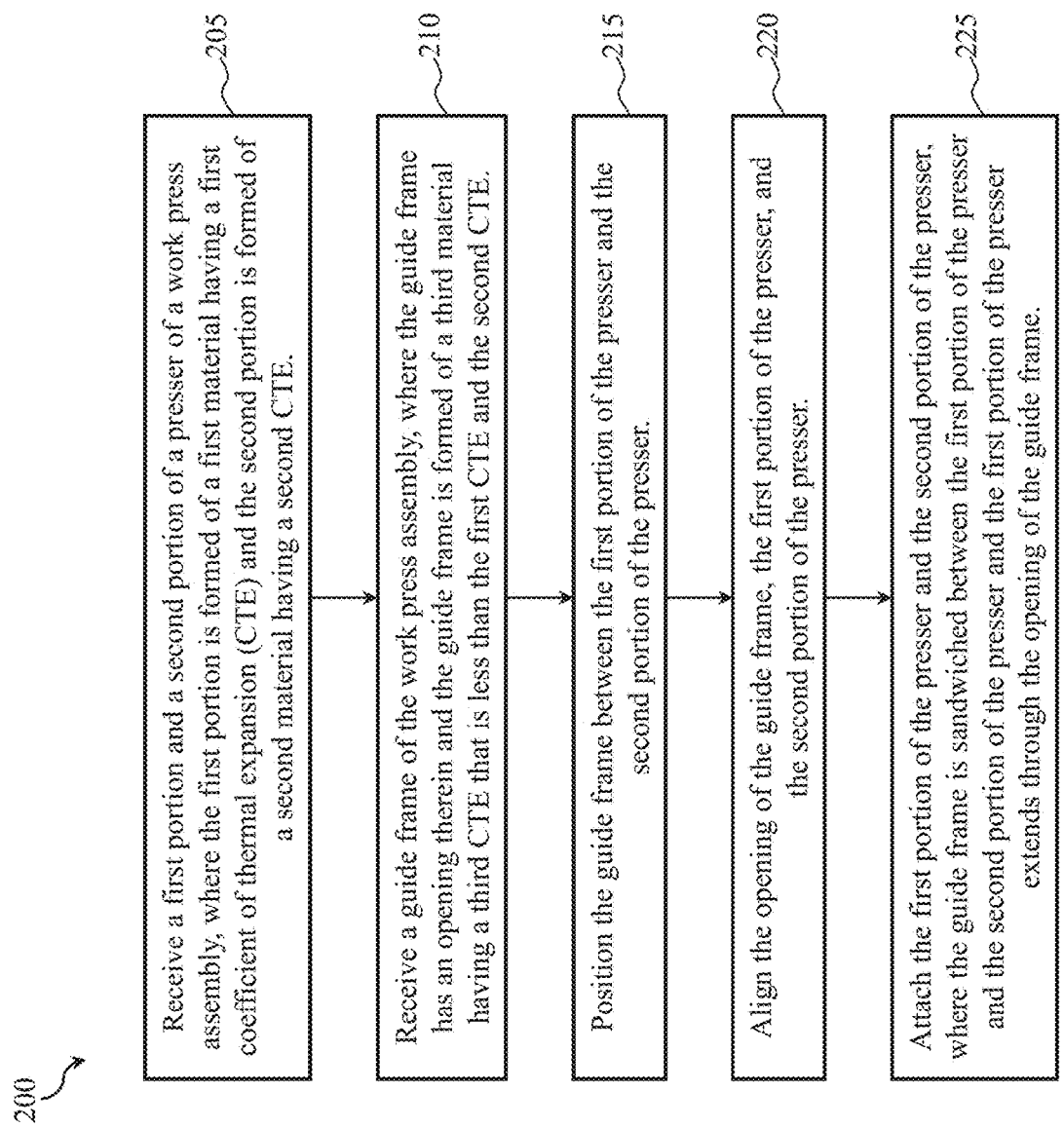
FIG. 7 is a flow chart of a method for assembling a work press assembly of a test handler according to various aspects of the present disclosure.

FIG. 7 is a flow chart of a method 200 for assembling a work press assembly of a test handler, such as work press assembly 100 of test handler 15 described herein, according to various aspects of the present disclosure. At block 205, method 200 includes receiving a first portion and a second portion of a presser of a work press assembly. The first portion is formed of a first material having a first thermal conductivity and a first coefficient of thermal expansion (CTE) and the second portion is formed of a second material having a second thermal conductivity and a second CTE. In some embodiments, the first material is the same as the second material. In some embodiments, the first portion of the presser is a contact block, such as contact block 104, and the second portion of the presser can be a connector, such as connector 106. In some embodiments, the first portion and the second portion of presser form a contact block. At block 210, method 200 includes receiving a guide frame of the work press assembly. The guide frame is formed of a third material having a third thermal conductivity and a third CTE. The third thermal conductivity is less than the first thermal conductivity and the second thermal conductivity. The third CTE is less than the first CTE and the second CTE. The guide frame has an opening therein. In some embodiments, the guide frame is guide frame 108.

At block 215, method 200 includes positioning the guide frame between the first portion of the presser and the second portion of the presser. At block 220, method 200 includes aligning the opening of the guide frame, the first portion of the presser, and the second portion of the presser. In some embodiments, the aligning includes aligning fastening means of the first portion of the presser and the second portion of the presser, such as attachment holes of the first portion of the presser with attachment pins of the second portion of the presser, or vice versa. In some embodiments, the aligning includes aligning the first portion of the presser with the opening in the guide frame, such that the first portion of the presser can be guided through the opening. In some embodiments, the aligning includes center aligning the opening of the guide frame and/or the guide frame, the first portion of the presser, and the second portion of the presser. In some embodiments, the aligning includes aligning the first portion of the presser with an inner frame of the guide frame to provide spacing between an outer frame of the guide frame and sidewalls of the first portion of the presser and/or spacing between sidewalls of the inner frame of the guide frame and sidewalls of the first portion of the presser when assembled. In some embodiments, the aligning includes aligning the second portion of the presser with an inner frame of the guide frame to provide spacing between an outer frame of the guide frame and sidewalls of the second portion of the presser when assembled. At block 225, method 200 includes attaching the first portion of the presser and the second portion of the presser, where the guide frame is sandwiched between the first portion of the presser and the second portion of the presser and the first portion of the presser extends through the opening of the guide frame. In some embodiments, the attaching includes bringing the fastening means of the first portion of the presser and the second portion of the presser into contact, such as inserting attachment pins of the second portion of the presser into attachment holes of the first portion of the presser. In some embodiments, the attaching includes compressing the guide frame between the first portion of the presser and the second portion of the presser. For example, the first portion of the presser and the second portion of the presser are pushed onto opposite surfaces of the guide frame, such as an inner, recessed ledge of the guide frame. In some embodiments, the opposite surfaces of the guide frame can be provided by thermal insulation layers. FIG. 7 has been simplified for the sake of clarity to better understand the inventive concepts of the present disclosure. Additional steps can be provided before, during, and after method 200, and some of the steps described can be moved, replaced, or eliminated for additional embodiments of method 200.

An improved work press assembly for a test handler is disclosed herein that can reduce thermal conductivity, and thus thermal expansion, of an outer, guide pin receiving region thereof. An exemplary work press assembly for a test handler can include a presser and a guide frame. The presser is configured to pick up a device under test (DUT) and press the DUT into a socket for testing. The presser is formed of a first material having a first coefficient of thermal expansion (CTE). The guide frame is configured to receive guide pins of the socket. The presser extends through an opening of the guide frame, the guide frame is sandwiched between a first portion of the presser and a second portion of the presser, and the guide frame is formed from a second material having a second CTE that is less than the first CTE. In some embodiments, sidewalls of the presser do not physically contact the guide frame.

In some embodiments, the first material has a first thermal conductivity, the second material has a second thermal conductivity, and the first thermal conductivity is greater than the second thermal conductivity. In some embodiments, the guide frame includes a thermal insulation layer disposed between and separating the presser from the second material of the guide frame. In some embodiments, the work press further includes a thermal source connected to the presser, and the first material of the presser can transfer heat between the thermal source and the DUT (i.e., the first material is thermally conductive).

In some embodiments, a spacing is between sidewalls of the presser and sidewalls of the guide frame, and the spacing is configured to accommodate thermal expansion of the presser. In some embodiments, the first material is aluminum, copper, or a combination thereof. In some embodiments, the second material is aluminum silicon carbide, steel, ceramic, or combinations thereof. In some embodiments, the guide frame has an outer frame having a first thickness and an inner frame having a second thickness. The second thickness is less than the first thickness, and the inner frame is sandwiched between the first portion of the presser and the second portion of the presser. In some embodiments, the first portion of the presser has a first width, the second portion of the presser has a second width, and the opening of the guide frame has a third width. The first width and the second width are each greater than the third width and less than a distance between inner sidewalls of the outer frame.

An exemplary work press assembly for a test handler configured to transport a device under test (DUT) in a testing system can include a thermal source, a presser, and a guide frame. The thermal source is for managing a temperature of the DUT. The presser has a first press portion fixedly attached to a second press portion. The first press portion is configured to secure the DUT thereto, and the second press portion is connected to the thermal source. The guide frame has an outer frame, an inner frame, an opening formed by the inner frame, and guide holes formed in the outer frame. The first press portion extends through the opening, and the inner frame is secured between the first press portion and the second press portion. The first press portion is formed from a first material having a first thermal conductivity and a first coefficient of thermal expansion (CTE), the guide frame is formed from a second material having a second thermal conductivity and a second CTE, the second thermal conductivity is less than the first thermal conductivity, and the second CTE is less than the first CTE.

In some embodiments, the second press portion is formed from a third material having a third thermal conductivity and a third CTE, the second thermal conductivity is less than the third thermal conductivity, and the second CTE is less than the third CTE. In some embodiments, wherein the third material is the same as the first material.

In some embodiments, a first gap is between an inner frame sidewall and a first sidewall of the first press portion, a second gap is between a first outer frame sidewall and a second sidewall of the first press portion, and a third gap is between a second outer frame sidewall and a sidewall of the second press portion.

In some embodiments, the work press assembly further includes a first fiberglass layer and a second fiberglass layer. The inner frame is sandwiched between the first fiberglass layer and the second fiberglass layer, such that the first fiberglass layer separates the inner frame and the first press portion and the second fiberglass layer separates the inner frame and the second press portion. In some embodiments, the first press portion and the second press portion are configured to vacuum suction the DUT to the presser.

In some embodiments, the first press portion has a middle portion disposed between a top portion and a bottom portion. The top portion is disposed within the opening of the guide frame and connected to the second press portion. A gap is formed between the middle portion of the first press portion and the second press portion, and the inner frame partially fills the gap. In some embodiments, a width of the top portion is less than a width of the opening, a width of the middle portion is greater than the width of the opening, and a width of the second press portion is greater than the width of the opening. In some embodiments, the middle portion and the second press portion do not physically contact the outer frame of the guide frame.

An exemplary method for assembling a work press assembly of a test handler includes receiving a first portion and a second portion of a presser of the work press assembly. The first portion is formed of a first material having a first coefficient of thermal expansion (CTE) and the second portion is formed of a second material having a second CTE. The method further includes receiving a guide frame of the work press assembly. The guide frame has an opening therein, the guide frame is formed of a third material having a third CTE, and the third CTE is less than the first CTE and the second CTE. The method further includes positioning the guide frame between the first portion of the presser and the second portion of the presser. The method further includes aligning the opening of the guide frame, the first portion of the presser, and the second portion of the presser. The method further includes attaching the first portion of the presser and the second portion of the presser. The guide frame is sandwiched between the first portion of the presser and the second portion of the presser, and the first portion of the presser extends through the opening of the guide frame.

In some embodiments, the guide frame includes an inner frame and an outer frame, and the inner frame forms the opening. In such embodiments, the aligning can include aligning the first portion of the presser and the second portion of the presser with the inner frame of the guide frame, such that a first spacing is between the first portion of the presser and the outer frame of the guide frame, a second spacing is between the first portion of the presser and the inner frame of the guide frame, and a third spacing is between the second portion of the presser and the outer frame of the guide frame. In some embodiments, attaching the first portion of the presser and the second portion of the presser includes pushing the first portion of the presser and the second portion of the presser against opposite surfaces of the guide frame, wherein the opposite surfaces of the guide frame are formed by thermal insulation layers.

An exemplary method for fabricating a work press assembly of a test handler includes forming a first press portion and a second press portion of a presser of the work press assembly. The first press portion and the second press portion are formed of a first material having a first coefficient of thermal expansion (CTE). The method further includes forming a guide frame of the work press assembly. The guide frame can have an outer frame, an inner frame, an opening formed by the inner frame, and guide holes in the outer frame. The outer frame and the inner frame are formed of a second material having a second CTE, and the second CTE is less than the first CTE. The guide frame can further include one or more thermal insulation layers, such as fiberglass layers, disposed on the inner frame. The method further includes assembling the first press portion, the second press portion, and the guide frame, wherein the inner frame is sandwiched between the first press portion and the second press portion when assembled.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A work press assembly for a test handler, the work press assembly comprising:
    a presser configured to pick up a device under test (DUT) and press the DUT into a socket for testing, wherein the presser is formed of a first material having a first coefficient of thermal expansion (CTE); and
    a guide frame configured to receive guide pins of the socket, wherein the presser extends through an opening of the guide frame, the guide frame is sandwiched between a first portion of the presser and a second portion of the presser, and the guide frame is formed from a second material having a second CTE that is less than the first CTE.

2. The work press assembly for the test handler of claim 1, wherein the guide frame has an outer frame having a first thickness, an inner frame having a second thickness, the second thickness is less than the first thickness, and the inner frame is sandwiched between the first portion of the presser and the second portion of the presser.

3. The work press assembly for the test handler of claim 2, wherein:
    the first portion of the presser has a first width, the second portion of the presser has a second width, and the opening of the guide frame has a third width; and
    the first width and the second width are each greater than the third width and less than a distance between inner sidewalls of the outer frame.

4. The work press assembly for the test handler of claim 1, wherein the first material has a first thermal conductivity, the second material has a second thermal conductivity, and the first thermal conductivity is greater than the second thermal conductivity.

5. The work press assembly for the test handler of claim 1, wherein a spacing is between sidewalls of the presser and sidewalls of the guide frame, wherein the spacing is configured to accommodate thermal expansion of the presser.

6. The work press assembly for the test handler of claim 1, wherein the guide frame includes a thermal insulation layer disposed between and separating the presser from the second material of the guide frame.

7. The work press assembly for the test handler of claim 1, further comprising a thermal source connected to the presser, wherein the first material of the presser can conduct thermal energy between the thermal source and the DUT.

8. The work press assembly for the test handler of claim 1, wherein sidewalls of the presser do not physically contact the guide frame.

9. The work press assembly for the test handler of claim 1, wherein:
    the first material is aluminum, copper, or a combination thereof; and
    the second material is aluminum silicon carbide, steel, ceramic, or combinations thereof.

10. A work press assembly for a test handler configured to transport a device under test (DUT) in a testing system, the work press assembly comprising:
    a thermal source for managing a temperature of the DUT;
    a presser having a first press portion fixedly attached to a second press portion, wherein the first press portion is configured to secure the DUT thereto, the second press portion is connected to the thermal source, the first press portion is formed from a first material having a first thermal conductivity and a first coefficient of thermal expansion (CTE); and
    a guide frame having an outer frame, an inner frame, an opening formed by the inner frame, and guide holes formed in the outer frame, wherein the first press portion extends through the opening, the inner frame is secured between the first press portion and the second press portion, and the guide frame is formed from a second material having a second thermal conductivity and a second CTE, wherein the second thermal conductivity is less than the first thermal conductivity and the second CTE is less than the first CTE.

11. The work press assembly for the test handler of claim 10, wherein a first gap is between an inner frame sidewall and a first sidewall of the first press portion, a second gap is between a first outer frame sidewall and a second sidewall of the first press portion, and a third gap is between a second outer frame sidewall and a sidewall of the second press portion.

12. The work press assembly for the test handler of claim 10, further comprising a first fiberglass layer and a second fiberglass layer, wherein the inner frame is sandwiched between the first fiberglass layer and the second fiberglass layer, such that the first fiberglass layer separates the inner frame and the first press portion and the second fiberglass layer separates the inner frame and the second press portion.

13. The work press assembly for the test handler of claim 10, wherein the second press portion is formed from a third material having a third thermal conductivity and a third CTE, the second thermal conductivity is less than the third thermal conductivity, and the second CTE is less than the third CTE.

14. The work press assembly for the test handler of claim 13, wherein the third material is the same as the first material.

15. The work press assembly for the test handler of claim 14, wherein:
    the first press portion has a middle portion disposed between a top portion and a bottom portion, wherein the top portion is disposed within the opening of the guide frame and connected to the second press portion; and
    a gap is formed between the middle portion of the first press portion and the second press portion, wherein the inner frame partially fills the gap.

16. The work press assembly for the test handler of claim 15, wherein a width of the top portion is less than a width of the opening, a width of the middle portion is greater than the width of the opening, a width of the second press portion is greater than the width of the opening, and the middle portion and the second press portion do not physically contact the outer frame.

17. The work press assembly for the test handler of claim 10, wherein the first press portion and the second press portion are configured to vacuum suction the DUT to the presser.

18. A method for assembling a work press assembly of a test handler comprising:
    receiving a first portion and a second portion of a presser of the work press assembly, wherein the first portion is formed of a first material having a first coefficient of thermal expansion (CTE) and the second portion is formed of a second material having a second CTE;
    receiving a guide frame of the work press assembly, wherein the guide frame has an opening therein, the guide frame is formed of a third material having a third CTE, and the third CTE is less than the first CTE and the second CTE;
    positioning the guide frame between the first portion of the presser and the second portion of the presser;
    aligning the opening of the guide frame, the first portion of the presser, and the second portion of the presser; and
    attaching the first portion of the presser and the second portion of the presser, wherein the guide frame is sandwiched between the first portion of the presser and the second portion of the presser and the first portion of the presser extends through the opening of the guide frame.

19. The method of claim 18, wherein:
    the guide frame includes an inner frame and an outer frame, wherein the inner frame defines the opening; and
    the aligning includes aligning the first portion of the presser and the second portion of the presser with the inner frame of the guide frame, such that a first spacing is between the first portion of the presser and the outer frame of the guide frame, a second spacing is between the first portion of the presser and the inner frame of the guide frame, and a third spacing is between the second portion of the presser and the outer frame of the guide frame.

20. The method of claim 18, wherein the attaching the first portion of the presser and the second portion of the presser includes pushing the first portion of the presser and the second portion of the presser against opposite surfaces of the guide frame, wherein the opposite surfaces of the guide frame are formed by thermal insulation layers.

* * * * *